(12) United States Patent
Peel (10) Patent No.: US 7,692,419 B1
(45) Date of Patent: Apr. 6, 2010

(54) METHOD AND APPARATUS FOR ENHANCED FREQUENCY MEASUREMENT

(75) Inventor: John Peel, Bothell, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 134 days.

(21) Appl. No.: 11/527,898

(22) Filed: Sep. 26, 2006

Related U.S. Application Data (60) Provisional application No. 60/720,853, filed on Sep. 26, 2005.

(51) Int. Cl.
  *G06M 1/10* (2006.01)
  *G01R 23/14* (2006.01)
(52) U.S. Cl. ............... 324/76.48; 324/76.41; 324/76.16
(58) Field of Classification Search ............... 324/76.48, 324/76.16
  See application file for complete search history.

(56) References Cited

U.S. PATENT DOCUMENTS

| | | | | |
|---|---|---|---|---|
| 5,381,085 A | * | 1/1995 | Fischer | 324/76.48 |
| 6,016,081 A | * | 1/2000 | O'Shaughnessy | 331/48 |
| 6,294,935 B1 | * | 9/2001 | Ott | 327/150 |
| 7,151,399 B2 | * | 12/2006 | Kaizuka | 327/295 |
| 7,301,414 B2 | * | 11/2007 | Hino | 331/179 |
| 2005/0040904 A1 | * | 2/2005 | Sakurai | 331/176 |

* cited by examiner

*Primary Examiner*—Jeff Natalini (57) ABSTRACT

A system and method for enhanced frequency measurement. Embodiments provide an effective mechanism for reducing error associated with frequency measurements by amplifying the frequency of the signal fed to the frequency counter, thereby increasing the number of counts and reducing the error associated with each frequency measurement. Reductions in error enable the gate time for the frequency counter to be reduced, thereby increasing efficiency and cost-savings. After accessing the counts provided for the amplified frequency, the original frequency before amplification may be determined by reducing the amplified frequency (e.g., represented by the accessed counts) by the amount by which the original frequency was amplified. Embodiments provide an effective and efficient mechanism for automatically determining the amount of amplification for a given signal based upon its frequency and a maximum frequency of at least one of the frequency amplification component and the frequency counter.

15 Claims, 5 Drawing Sheets

METHOD AND APPARATUS FOR ENHANCED FREQUENCY MEASUREMENT

RELATED APPLICATIONS

The present application is related to and claims the benefit of U.S. Provisional Application No. 60/720,853, filed Sep. 26, 2005, entitled "METHOD FOR INCREASING FREQUENCY COUNTER ACCURACY," naming John Peel as the inventor, assigned to the assignee of the present invention. That application is incorporated herein by reference in its entirety and for all purposes.

BACKGROUND OF THE INVENTION

As integrated circuit technology advances, tighter and tighter tolerances are required for frequency generation devices. Modern integrated circuits require frequency signals for clocking and other exacting tasks, where the quality of the signal may have a significant impact on performance. As such, frequency measurement of signals from frequency generation devices (e.g., crystals, oscillators, voltage-controlled oscillators, etc.) need to be both accurate and precise to ensure acceptable signals for use with modern integrated circuits.

Although several types of conventional frequency measurement devices are used, gated frequency counters are one of the most common. Gated frequency counters are N-bit counters which count repetitions of an input signal over a predetermined period of time, often referred to as the "gate time." The count obtained during the gate time may then be divided by the gate time to determine the frequency of the input signal. Additionally, gated frequency counters have an error of +/−one count due to incorrect counting at either end of the gate time. As such, the error associated with frequency measurements using gated frequency counters is proportional to the count, where the error increases as the number of counts for a given frequency measurement decreases.

Despite their suitability for less-demanding applications, conventional implementations using gated frequency counters do not provide sufficient accuracy and precision for high-quality frequency measurements. For example, gated frequency counters often provide a low number of counts when measuring a frequency due to the use of a small gate time. Given that small counts produce large errors, frequency measurements taken with conventional gated frequency counters therefore have large errors making them unsuitable for more-demanding applications. Additionally, although an increase in the gate time of a conventional implementation using a frequency counter may provide a reduction in error, the reduction is very small and brings with it a large decrease in efficiency and increase in costs. As such, increasing the gate time is an undesirable option.

SUMMARY OF THE INVENTION

Accordingly, a need exists for a frequency measurement system with reduced error, where the reduction in error is provided without significant cost and efficiency penalties. Additionally, a need exists for reduced error in implementations using gated frequency counters. And further, a need exists for gated frequency counters which allow for reduced gate times while maintaining an acceptable error. Embodiments of the present invention provide novel solutions to these needs and others as described below.

Embodiments of the present invention provide a system and method for enhanced frequency measurement. More specifically, embodiments provide an effective mechanism for reducing error associated with frequency measurements by amplifying the frequency of the signal fed to the frequency counter, thereby increasing the number of counts and reducing the error associated with each frequency measurement. Reductions in error enable the gate time for the frequency counter to be reduced, thereby increasing efficiency and cost-savings. After accessing the counts provided for the amplified frequency, the original frequency before amplification may be determined by reducing the amplified frequency (e.g., represented by the accessed counts) by the amount by which the original frequency was amplified. Additionally, embodiments provide an effective and efficient mechanism for automatically determining the amount of amplification for a given signal based upon its frequency and a maximum frequency of at least one of the frequency amplification component and the frequency counter.

In one embodiment, a system for measuring signal frequency includes a frequency amplification component for accessing an input signal of a first frequency and generating a modified input signal of a second frequency, wherein the second frequency is a function of the first frequency. The system also includes a frequency counter coupled to the frequency amplification component, the frequency counter operable to access the modified input signal and measure the second frequency. A logic component is coupled to the frequency counter for receiving a signal representing a measurement of the second frequency, wherein the logic component is operable to determine the first frequency based upon the function relating the second frequency to the first frequency. The system may also include a control component coupled to the frequency amplification component, the control component for increasing an amplification factor by which the first frequency is amplified to produce the second frequency, and wherein the amplification factor is automatically determined such that the second frequency is maximized without exceeding an allowable maximum frequency.

In another embodiment, a method of measuring signal frequency includes accessing an input signal of a first frequency. A modified input signal is generated of a second frequency, wherein the second frequency is a function of the first frequency, and wherein the second frequency is larger than the first frequency. Thereafter, the modified input signal is accessed and the second frequency is measured using a frequency counter. The first frequency is then determined based upon the function relating the second frequency to the first frequency. The method may also include measuring the first frequency, determining a maximum frequency for the modified input signal, and automatically determining the function relating the first and second frequencies such that the second frequency has a value between the first frequency and the maximum frequency.

In yet another embodiment, a method of measuring signal frequency includes accepting an input indicating a count duration for a frequency counter, wherein the frequency counter is updated during the count duration. An input signal of a first frequency is accessed. A modified input signal of a second frequency is then generated, wherein the second frequency is a multiple of the first frequency. The modified input signal is then accessed and the second frequency is measured during the count duration using the frequency counter. Thereafter, the first frequency is determined by dividing the second frequency by the multiple. The method may also include measuring the first frequency, determining a maximum frequency for the modified input signal, and automatically determining the multiple such that the second frequency has a value between the first frequency and the maximum frequency.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 1:
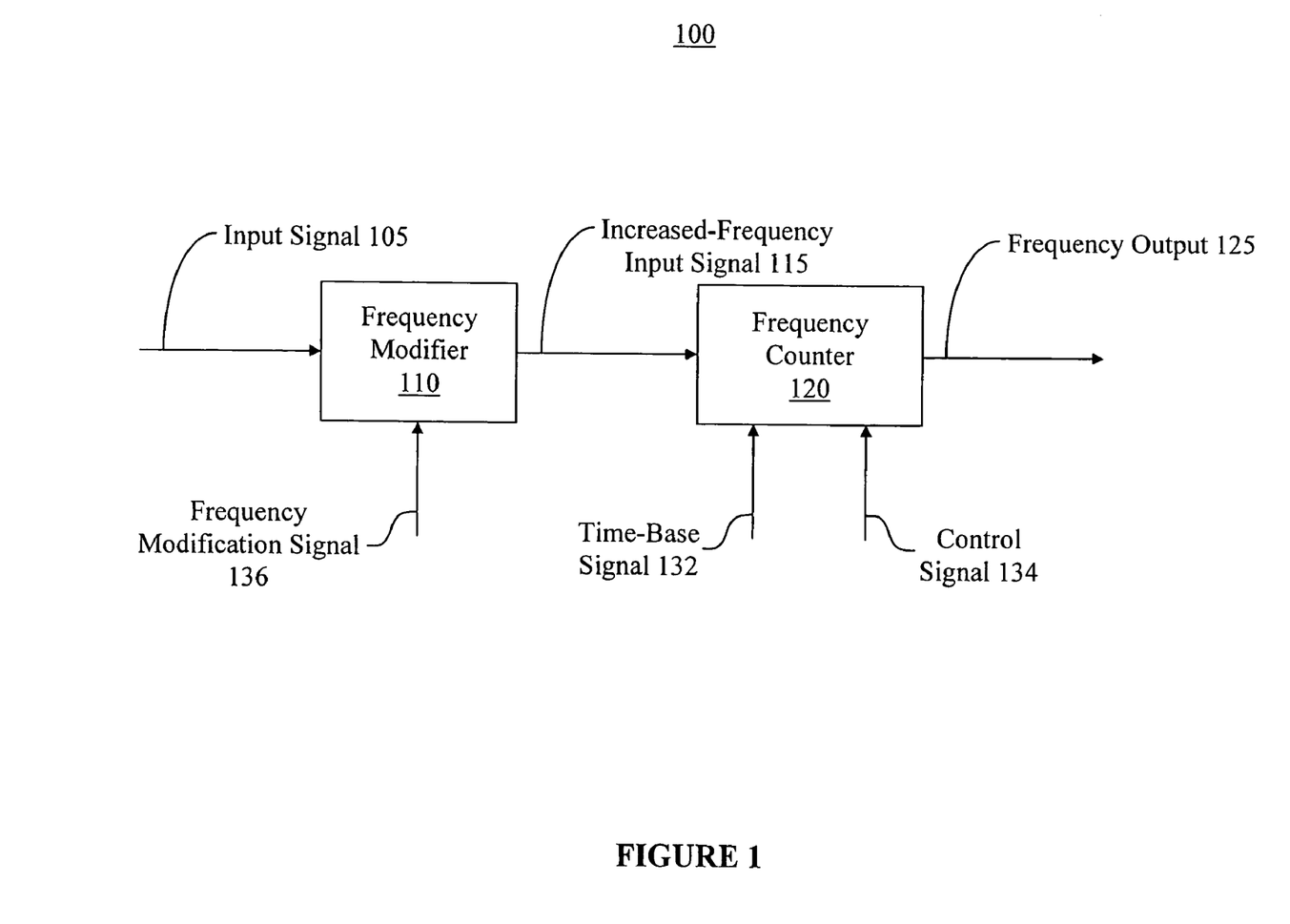
FIG. 1 shows an exemplary system for enhanced frequency measurement in accordance with one embodiment of the present invention.

FIG. 1 shows exemplary system 100 for enhanced frequency measurement in accordance with one embodiment of the present invention. As shown in FIG. 1, frequency modifier circuit 110 is coupled to frequency counter circuit 120 for frequency amplification of the signal fed to frequency counter 120. Since increased-frequency input signal 115 output from frequency modifier 110 has a larger frequency than input signal 105 fed to frequency modifier 110, increased-frequency input signal 115 will produce a larger count (e.g., frequency output 125) when fed to counter 120 than input signal 105 for a given gate time. The frequency of input signal 105 may then be determined by accessing frequency output 125 and reducing it by the amount of frequency amplification applied to input signal 105 by frequency modifier 110. As such, the error associated with frequency counter 120 is decreased by increasing the number of counts for a given frequency measurement.

The value of frequency counter 120 represented by frequency output 125 may be based upon both time-base signal 132 and control signal 134. For example, where counter 120 is implemented using an N-bit counter, control signal 134 may be used to control the length of the gate time during which frequency counter 120 may update, where the gate time is a defined number of periods of time-base signal 132. Additionally, control signal 134 may control when the gate time should begin and/or end.

As shown in FIG. 1, frequency output 125 may comprise a signal representing a count stored within frequency counter 120. Output 125 may occur in response to a signal (e.g., via control signal 134) requesting a count output, where the count output may be stored within a memory coupled to or integrated within counter 120. Alternately, frequency output 125 may represent an access of a count (e.g., stored in a memory coupled to or integrated within counter 120) by an external device, component, system, etc.

Frequency modifier 110 may comprise any device capable of accessing an input signal (e.g., 105) and generating an output signal (e.g., 115) with an amplified frequency (e.g., greater than the frequency of the input signal). In one embodiment, frequency modifier 110 may be implemented by a phase-locked loop (PLL) frequency multiplier circuit.

As shown in FIG. 1, frequency modifier 110 may receive frequency modification signal 136 for indicating an amount by which the frequency of the input signal (e.g., 105) should be increased, where signal 136 may comprise data indicating the amount of amplification, a signal for setting an amplification mode of frequency modifier 120, etc. For example, frequency modification signal 136 may indicate a multiple (e.g., 2, 5, 10, etc.) by which the frequency of the input signal (e.g., 105) should be increased. Alternatively, frequency modification signal 136 may indicate a function (e.g., $F_{out}=2F_{in}+1000$, $F_{out}=(F_{in})^2-100$, etc.) representing the relationship between the input (e.g., 105) and output (e.g., 115) signals.

The amount of frequency amplification provided by frequency modifier 110 affects the error associated with frequency measurements of counter 120. In one embodiment, where the output signal frequency is a multiple of the input signal frequency, the error may be inversely proportional to the value of the multiple. For example, if the frequency of the output signal (e.g., 115) is 10 times the frequency of the input signal (e.g., 105), then the error associated with a frequency measurement of the amplified signal may be 1/10 that of the non-amplified input signal. As such, a frequency amplification of times results in a 90% reduction in error. Additionally, the reduction in the error may result from the accuracy of the counter (e.g., 120) remaining the same (e.g., +/−one count) and the number of counts increasing based upon the amount of frequency amplification applied by a coupled frequency modifier (e.g., 110).

Given the error reduction provided by frequency modifier 110, the gate time of the frequency counter can be reduced while still benefiting from a significant reduction in error associated with a frequency measurement. For example, if frequency modifier 110 applies a 10× frequency amplification to input signal 105, the gate time may be cut in half and still provide an 80% reduction in error (e.g., 1/5 the error instead of 1/10 the error). Thus, the test time for acquiring the count is cut in half, thereby doubling the efficiency and cost-savings while still maintaining an 80% reduction in error over conventional frequency measurements.

Figure 2:
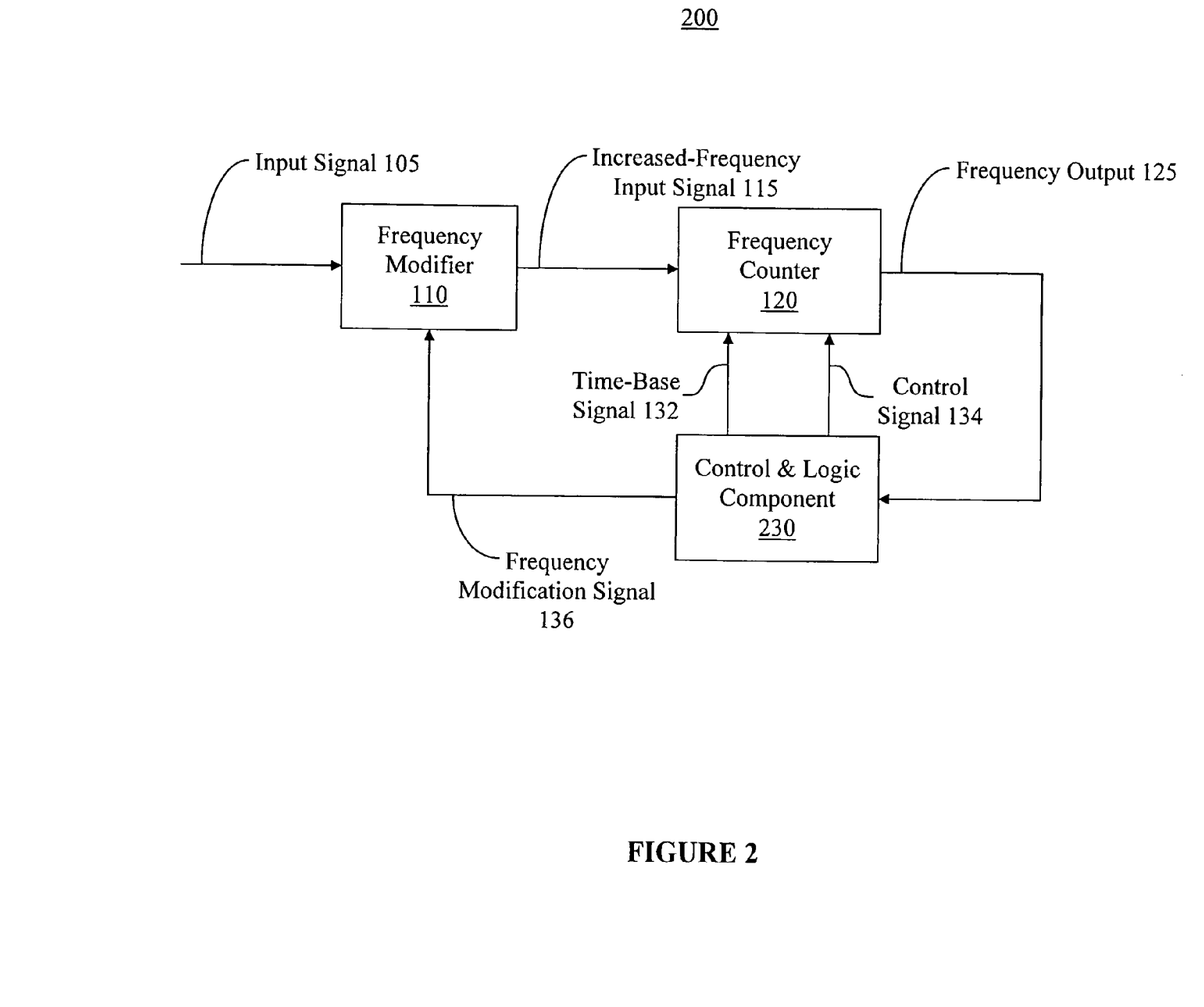
FIG. 2 shows an exemplary system with additional control components for enhanced frequency measurement in accordance with one embodiment of the present invention.

FIG. 2 shows exemplary system 200 with additional control components for enhanced frequency measurement in accordance with one embodiment of the present invention. Similar to system 100 of FIG. 1, system 200 comprises frequency modifier 110 for amplifying the frequency of input signal 105 to generate increased-frequency input signal 115, where the frequency of signal 115 is measured by frequency counter 120 (e.g., in accordance with time-base signal 132 and control signal 134) to enable determination of the frequency of input signal 105 with reduced error. However, system 200 also comprises control and logic component 230. As depicted in FIG. 1, component 230 is coupled to counter 120 and frequency modifier 110 for determining a frequency of input signal 105 and automatically determining the amount of frequency amplification applied by frequency modifier 110 to input signal 105, each of which will be discussed in turn.

Control and logic component 230 may determine the frequency of input signal 105 based upon a count accessed from counter 120 (e.g., via frequency output 125), the gate time (e.g., determined by time-base signal 132 and/or control signal 134) utilized to generate output 125, and the amount of frequency amplification applied by frequency modifier 110 (e.g., as dictated by frequency modification signal 136). For example, the count generated by counter 120 representing the frequency of increased-frequency input signal 115 may be converted to a frequency value (e.g., using a look-up table indexed based upon the count and the gate time used to generate the count, dividing the count by the gate time, etc.), which may then be used to derive the frequency of input signal 105 based upon the function relating the frequencies of signals 105 and 115 (e.g., by dividing the amplified frequency by the amplification multiple used by frequency modifier 110, by solving for the frequency of input signal 105 if a more complicated function is used by frequency modifier 110, etc.).

Alternatively, a count representing the frequency of input signal 105 may be derived from the accessed count generated by counter 120 representing the frequency of increased-frequency input signal 115 (e.g., by dividing the accessed count by the amplification multiple used by frequency modifier 110, by solving for the count representing the frequency of input signal 105 if a more complicated function is used by frequency modifier 110, etc.), which may then be converted to a frequency value representing the frequency of input signal 105 (e.g., using a look-up table indexed based upon the derived count and the gate time used to generate the accessed count, dividing the derived count by the gate time, etc.).

Component 230 may also automatically determine the amount of frequency amplification applied by frequency modifier 110 to input signal 105 based upon a maximum frequency for signal 115 and a rough frequency measurement of input signal 105. The maximum frequency may be a predetermined value (e.g., entered by a user, programmed into one or more components of system 200, based upon a maximum output frequency of frequency modifier 110, based upon a maximum input frequency of counter 120, etc.) that the frequency of signal 115 may not exceed. After a rough measurement of the frequency of input signal 105 is taken (e.g., by using counter 120 as discussed above after setting frequency modifier 110 to unity gain such that input signal 105 is not amplified, by using another counter or frequency measurement component directly coupled to input signal 105, etc.), component 230 may automatically determine a function for the frequency of signal 115 based upon the frequency measurement of input signal 105 and the maximum frequency. In one embodiment, the function may maximize the frequency of signal 115 such that it does not exceed the maximum frequency. As such, the function automatically determined by component 230 may be fed to frequency modifier 110 via frequency modification signal 136, where frequency modifier 110 may then amplify input signal 105 accordingly to enable the components of system 200 to measure the frequency of signal 115 with reduced error as discussed above.

A simple example may be used to further explain the automatic determination of an amplification function by component 230. For example, assume that the frequency of input signal 105 is roughly measured to be 10 MHz, the maximum frequency of signal 115 is determined to be 95 MHz, and component 230 is limited to automatic determination of integer multiples as amplification functions. Since the maximum frequency of 95 MHz falls between 90 MHz (a 9× amplification multiple) and 100 MHz (a 10× amplification multiple), component 230 may automatically determine that a 9× amplification multiple maximizes the frequency of signal 115 (e.g., 90 MHz) such that it does not exceed the maximum frequency of 95 MHz. As such, component 230 may output signal 136 to frequency modifier 110 such that input signal 105 may be amplified accordingly and the reduction in error associated with the frequency measurement is maximized (e.g., by maximizing the amplification function given the constraints listed above).

Component 230 may be implemented by a field-programmable gate array (FPGA), a complex programmable logic device (CPLD), or other system with programmable control and logic functionality. Alternatively, an application-specific integrated circuit (ASIC) may be used to implement component 230. As such, the operating parameters (e.g., types of amplification functions used, a maximum frequency used to automatically determine the amplification function, etc.) of component 230 may be determined and implemented either manually or automatically. Further, given the coupling of component 230 to other components (e.g., 110, 120, etc.) of system 200 as depicted in FIG. 2, similar control may be exerted over the other components of system 200. For example, the programmable system implementing component 230 may be used to input a gate time for counter 120.

Although FIG. 2 shows control and logic component 230 as a single component, it should be appreciated that component 230 may be split into two or more components (e.g., one for performing logic functions and one for performing control functions). Additionally, although specific interfaces (e.g., 125, 132 and 134) are depicted coupling counter 120 and component 230, it should be appreciated that a larger or smaller number of interfaces may be used in other embodiments to carry out the functionally described herein. Similarly, although a specific interface (e.g., 136) is depicted coupling frequency modifier 110 and component 230, it should be appreciated that a larger or smaller number of interfaces may be used in other embodiments to carry out the functionally described herein.

Figure 3:
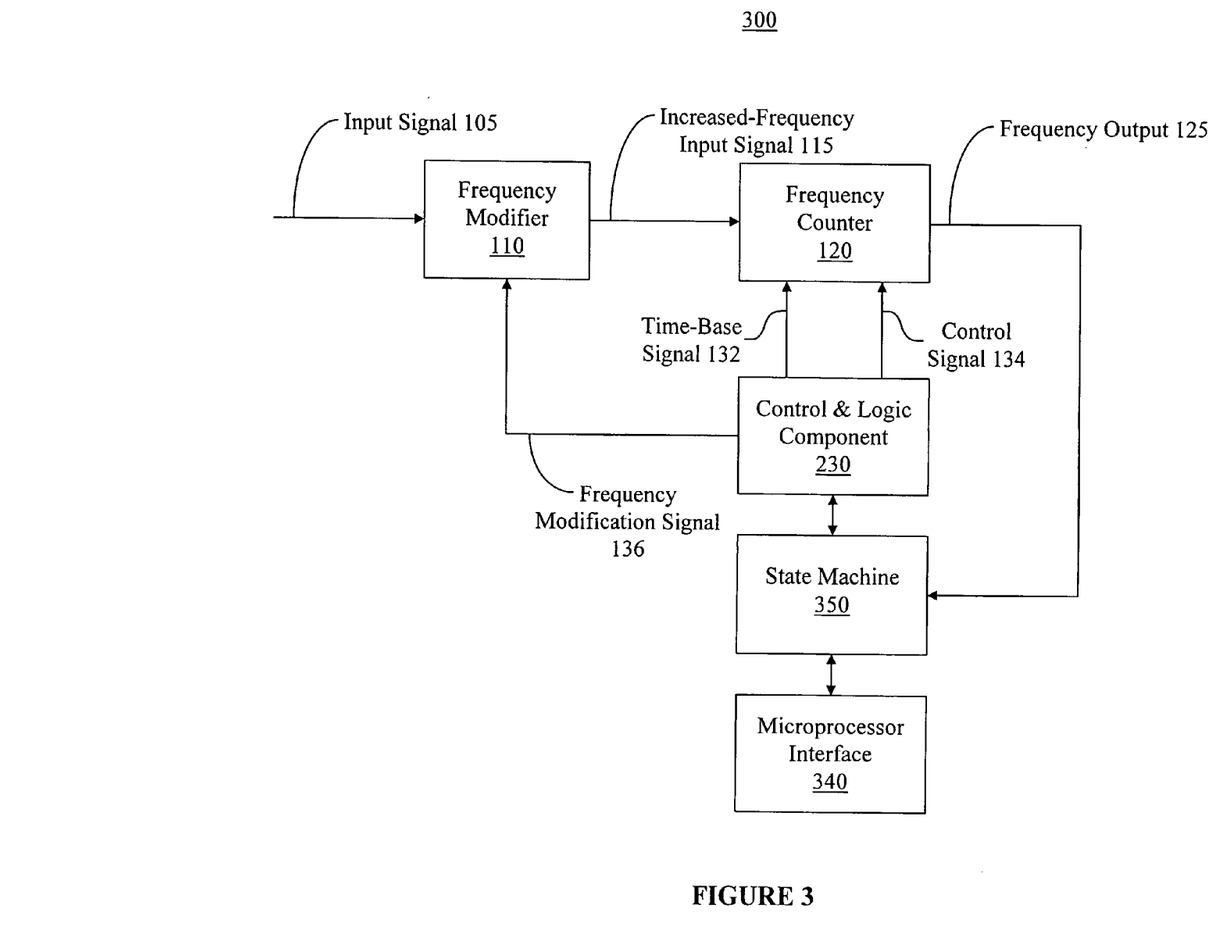
FIG. 3 shows an exemplary system with a state machine for enhanced frequency measurement in accordance with one embodiment of the present invention.

FIG. 3 shows exemplary system 300 with a state machine for enhanced frequency measurement in accordance with one embodiment of the present invention. Similar to system 200 of FIG. 2, system 300 comprises frequency modifier 110 for amplifying the frequency of input signal 105 to generate increased-frequency input signal 115, where the frequency of signal 115 is measured by frequency counter 120 (e.g., in accordance with time-base signal 132 and control signal 134) to enable determination of the frequency of input signal 105 with reduced error. Additionally, system 300 comprises control and logic component 230 for determining a frequency of input signal 105 and automatically determining the amount of frequency amplification applied by frequency modifier 110 to input signal 105. However, in contrast to system 200 of FIG. 2, system 300 additionally comprises state machine circuit 350 and microprocessor interface circuit 340.

As shown in FIG. 3, state machine 350 can access component 230 and frequency output 125, thereby providing state machine 350 control over system 300. As such, functionality implemented by component 230 as described above with respect to FIG. 2 may be offloaded to state machine 350, either in whole or in part. For example, state machine 350 may control the gate fed to counter 120, the amplification factor fed to frequency modifier 110 via signal 136, or the like. Additionally, state machine may perform frequency measurements based upon a count accessed from counter 120 and the amplification function fed to frequency modifier 110. Similarly, automatic determination of an amplification function for use by frequency modifier 110 may be performed by state machine 350. As such, to the extent functionality is offloaded to state machine 350 from component 230, component 230 may be used to convey signals from state machine 350 via microprocessor interface to other components of system 300 (e.g., 110, 120, etc.).

Alternatively, an external device, component or system can access component 230 via microprocessor interface 340, thereby providing external control over system 300. As such, the external hardware and/or software coupled to microprocessor interface 340 may be used to perform functions similar to state machine 350 discussed above. And in another embodiment, microprocessor interface 340 may be used to access and/or control state machine 350.

Although FIG. 3 shows control and logic component 230 as a single component, it should be appreciated that component 230 may be split into two or more components (e.g., one for performing logic functions and one for performing control functions). Additionally, although specific interfaces (e.g., 125, 132 and 134) are depicted coupling counter 120 and component 230, it should be appreciated that a larger or smaller number of interfaces may be used in other embodiments to carry out the functionally described herein. Similarly, although a specific interface (e.g., 136) is depicted coupling frequency modifier 110 and component 230, it should be appreciated that a larger or smaller number of interfaces may be used in other embodiments to carry out the functionally described herein. Further, it should be appreciated that counts of counter 120 may be alternatively accessed (e.g., by coupling output 125 directly to component 230 and/or microprocessor interface 340, etc.).

Figure 4:
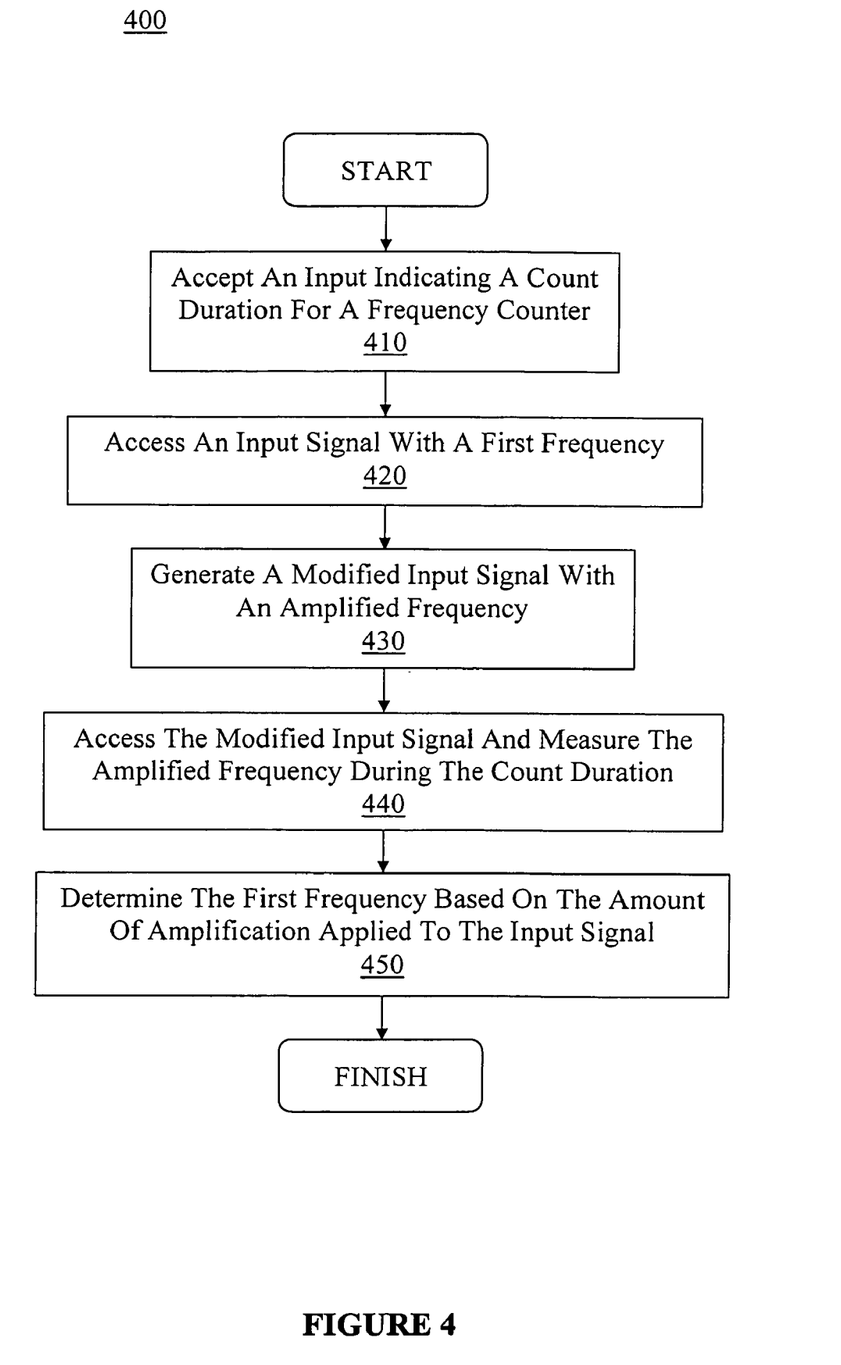
FIG. 4 shows a process for enhanced frequency measurement in accordance with one embodiment of the present invention.

FIG. 4 shows process 400 for enhanced frequency measurement in accordance with one embodiment of the present invention. As shown in FIG. 4, step 410 involves accepting an input indicating a count duration (e.g., a "gate time") for a frequency counter (e.g., 120). The input may be either manual (e.g., by a user) or automatic (e.g., by a system, device, component, etc.). The frequency counter may be an N-bit frequency counter which updates during the count duration, where the input indicating the count duration comprises a plurality of signals for controlling the counter (e.g., time-base signal 132, control signal 134, etc.).

Step 420 involves accessing an input signal with a first frequency. The input signal (e.g., 105) may be that input to a frequency modifier (e.g., 110) for frequency amplification before entering a coupled frequency counter (e.g., 120). The frequency modifier may be implemented by a phase-locked loop (PLL) frequency multiplier.

After accessing the input signal, a modified input signal may be generated with an amplified frequency in step 430. The amount of amplification may be determined by a function relating the first frequency of the input signal (e.g., 105) to the amplified frequency of the modified input signal (e.g., 115). A frequency modifier (e.g., 110) may receive a frequency modification signal (e.g., 136) for enabling the frequency modifier to amplify the signal in accordance with the function relating the frequencies of the input and modified input signals. The frequency modification signal (e.g., 136) may comprise data indicating the amount of amplification, a signal for setting an amplification mode of the frequency modifier (e.g., 120), etc.

As shown in FIG. 4, step 440 involves accessing the modified input signal and measuring the amplified frequency during the count duration. A frequency counter (e.g., 120) may be used to carry out step 440, where the error associated with frequency measurements of the frequency counter is dependent upon the number of counts obtained for a given count duration. For example, a frequency measurement generating more counts may have a smaller error than a frequency measurement with fewer counts. As such, the frequency measurement of the modified input signal has a smaller error than would be associated with a frequency measurement of the input signal given that the frequency of the modified input signal is greater than that of the input signal (e.g., due to the frequency amplification in step 430). Additionally, the error reduction may be further reduced by using greater frequency amplification, thereby providing significant error reduction even when using a smaller count duration to increase efficiency and cost-savings.

After measuring the frequency of the modified input signal, the first frequency of the input signal may be determined in step 450 based on the amount of amplification applied to the input signal. In one embodiment, the count generated representing the amplified frequency of the modified input signal (e.g., 115) may be converted to a frequency value (e.g., using a look-up table indexed based upon the count and the count duration used to generate the count, dividing the count by the count duration, etc.), which may then be used to derive the first frequency of the input signal (e.g., 105) based upon the function relating the frequencies of the input signal and modified input signal (e.g., by dividing the amplified frequency by the amplification multiple used by a frequency modifier, by solving for the first frequency of input signal if a more complicated function is used by a frequency modifier, etc.). Alternatively, a count representing the first frequency of the input signal (e.g., 105) may be derived from the accessed count generated representing the amplified frequency of modified input signal (e.g., by dividing the accessed count by the amplification multiple used by a frequency modifier, by solving for the count representing the first frequency of the input signal if a more complicated function is used by a frequency modifier, etc.), which may then be converted to a frequency value representing the first frequency of the input signal (e.g., using a look-up table indexed based upon the derived count and the count duration used to generate the accessed count, dividing the derived count by the count duration, etc.).

Figure 5:
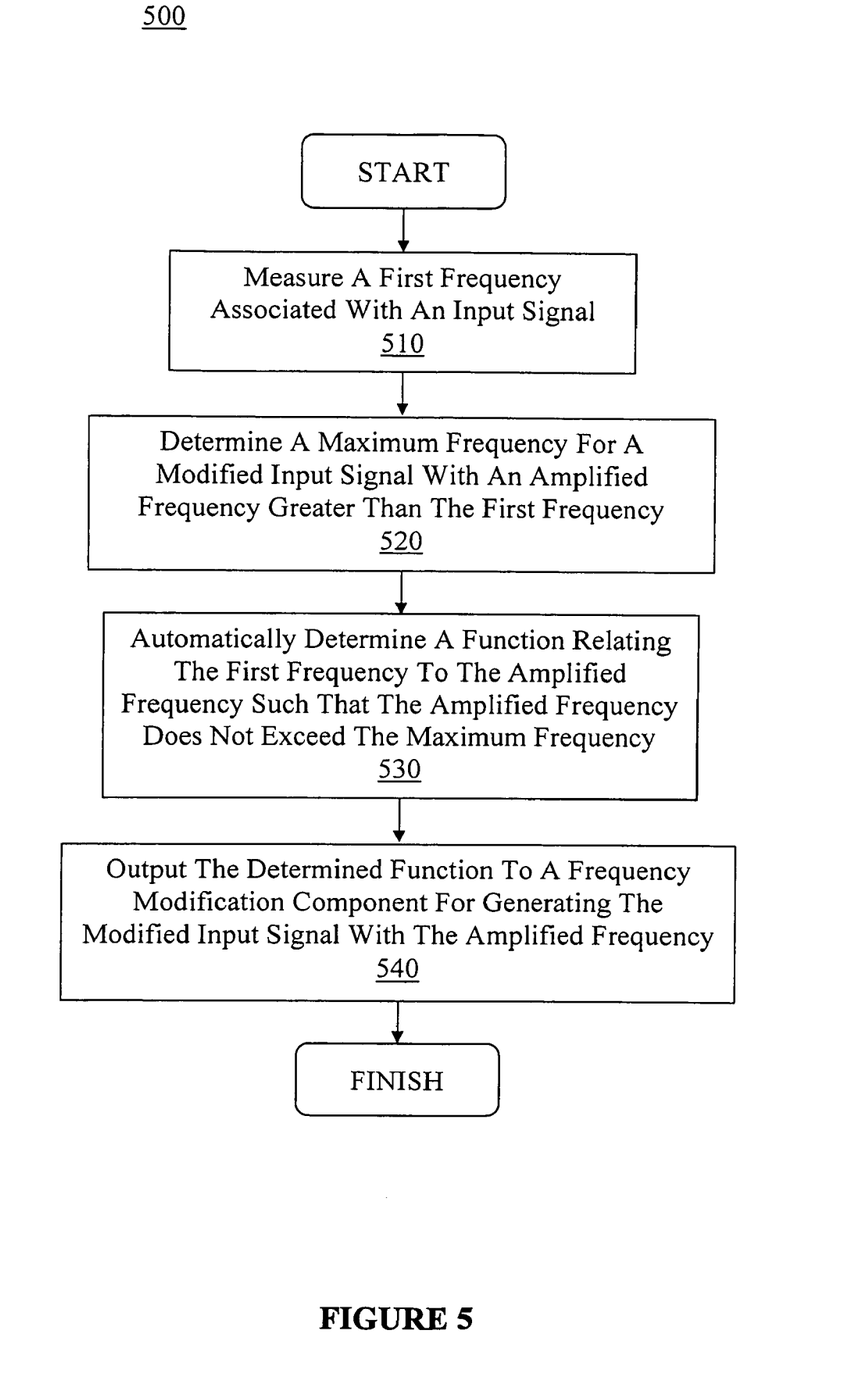
FIG. 5 shows a process for automatically determining a frequency amplification function in accordance with one embodiment of the present invention.

FIG. 5 shows process 500 for automatically determining a frequency amplification function in accordance with one embodiment of the present invention. As shown in FIG. 5, step 510 involves measuring a first frequency associated with an input signal (e.g., 105). A rough measurement of the first frequency may be made using a frequency counter (e.g., 120), where the first frequency of the input signal is not modified (e.g., fed directly to the frequency counter, fed through a frequency modifier with a unity gain to minimize modification, etc.). Alternatively, the first frequency may be measured in accordance with process 400 discussed above.

Step 520 involves determining a maximum frequency for a modified input signal with an amplified frequency greater than the first frequency of the input signal. The modified input signal (e.g., 115) may be generated as discussed above with respect to step 430 of FIG. 4. Additionally, the maximum frequency may be a predetermined value (e.g., entered by a user, programmed into one or more components of or coupled to a system for performing process 500, based upon a maximum output frequency of a frequency modifier, based upon a maximum input frequency of frequency counter, etc.) that the amplified frequency of the modified input signal (e.g., 115)

may not exceed. Alternatively, the maximum frequency may be further reduced below the predetermined value to provide a safety factor (e.g., to account for any error in rough frequency measurements in step 510).

After measuring a first frequency and determining a maximum frequency, a function relating the first frequency to the amplified frequency may be automatically determined in step 530 such that the amplified frequency does not exceed the maximum frequency. The function may comprise an integer multiple (e.g., 2, 5, 10, etc.), or instead comprise a more complicated function (e.g., $F_{out}=2F_{in}+1000$, $F_{out}=(F_{in})^2-100$, etc.). In one embodiment, the function may maximize the amplified frequency of the modified input signal (e.g., 115) such that it does not exceed the maximum frequency (e.g., determined in step 520).

As shown in FIG. 5, step 540 involves outputting the determined function to a frequency modification component for generating the modified input signal with the amplified frequency. As such, the frequency modification component (e.g., 110) may then amplify the input signal (e.g., 105) accordingly to enable the measurement of the amplified frequency of the modified input signal (e.g., 115) with reduced error as discussed above.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A system for measuring signal frequency, said system comprising:
   a frequency amplification component configured to access an input signal of a first frequency and generating a modified input signal of a second frequency;
   a frequency counter coupled to said frequency amplification component, said frequency counter operable to access said modified input signal and measure a quantity of counts during a gate time of said frequency counter, wherein said quantity of counts relates to said second frequency of said modified input signal;
   a logic component coupled to said frequency counter configured to receive a measurement of said quantity of counts, wherein said logic component is operable to determine said first frequency based upon said measurement of said quantity of counts; and,
   a control component coupled to said frequency amplification component, said control component configured to increase an amplification factor by which said first frequency is amplified to produce said second frequency, and wherein said amplification factor is automatically determined such that said second frequency has a maximized value between said first frequency and an allowable maximum frequency.

2. The system of claim 1, wherein said second frequency is a multiple of said first frequency, and wherein said logic component is operable to divide by dividing said quantity of counts by said multiple.

3. The system of claim 1, wherein said frequency amplification component is a phase-locked loop (PLL) frequency multiplier.

4. The system of claim 1, wherein said frequency counter is updated in response to detection of a repetition of said modified input signal, and wherein a value of said quantity of counts from said frequency counter after a predetermined period of time represents a measurement of said second frequency.

5. The system of claim 1, wherein said allowable maximum frequency is determined by specifications of at least one of said frequency amplification component and said frequency counter.

6. The system of claim 1, wherein said logic component is implemented by a microprocessor.

7. The system of claim 1, wherein said logic component is implemented by a field-programmable gate array (FPGA).

8. The system of claim 1, wherein said logic component is implemented by a complex programmable logic device (CPLD).

9. A method of measuring signal frequency, said method comprising:
   accessing an input signal of a first frequency;
   generating a modified input signal of a second frequency, and wherein said second frequency is larger than said first frequency;
   accessing said modified input signal and generating a measurement of a first quantity of counts using a frequency counter, during a gate time of said frequency counter, wherein said first quantity of counts relates to said second frequency of said modified input signal;
   determining said first frequency based upon said measurement of said first quantity of counts; and,
   determining a maximum frequency for said modified input signal, and automatically adjusting a function relating said first and second frequencies such that said second frequency is a multiple of said first frequency, said second frequency having a maximized value between said first frequency and said maximum frequency.

10. The method of claim 9, wherein said determining comprises dividing said first quantity of counts by said multiple.

11. The method of claim 9, wherein said generating a measurement of said first quantity of counts further comprises:
   updating said frequency counter in response to a detection of a repetitive portion of a waveform associated with said modified input signal; and accessing a value of said first quantity of counts from said frequency counter after a predetermined period of time, wherein said value represents said second frequency.

12. The method of claim 9, wherein said determining said first frequency further comprises:
   updating said frequency counter in response to a detection of a repetitive portion of a waveform associated with said input signal; and
   accessing a value of a second quantity of counts from said frequency counter after a predetermined period of time, wherein said value represents said first frequency.

13. A method of measuring signal frequency, said method comprising:
   accepting an input indicating a count duration for a frequency counter, wherein said frequency counter is updated during said count duration;
   accessing an input signal of a first frequency;
   generating a modified input signal of a second frequency, wherein said second frequency is a multiple of said first frequency;
   accessing said modified input signal and generating a measurement of a first quantity of counts during said count duration using said frequency counter, wherein said first quantity of counts relates to said second frequency of said modified input signal; and determining said first frequency comprises dividing said measurement of said-first quantity of counts by said multiple;

measuring said first frequency; and, determining a maximum frequency for said modified input signal; and automatically adjusting said multiple such that said second frequency has a maximized value between said first frequency and said maximum frequency.

14. The method of claim 13, further comprising updating said frequency counter in response to a detection of a repetitive portion of a waveform associated with said modified input signal; and accessing a value of said first quantity of counts from said frequency counter after said count duration, wherein said value of said first quantity of counts represents said second frequency.

15. The method of claim 13, wherein said measuring said first frequency further comprises:

updating said frequency counter in response to a detection of a repetitive portion of a waveform associated with said input signal; and accessing a value of a second quantity of counts from said frequency counter after said count duration, wherein said value represents said first frequency.

* * * * *